US012740104B2

(12) United States Patent
Breil et al.

(10) Patent No.: US 12,740,104 B2
(45) Date of Patent: Sep. 15, 2026

(54) METHODS FOR FORMING GATE STRUCTURES

(71) Applicant: Applied Materials, Inc., Santa Clara, CA (US)

(72) Inventors: Nicolas Louis Breil, San Jose, CA (US); Balasubramanian Pranatharthiharan, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 389 days.

(21) Appl. No.: 18/371,113

(22) Filed: Sep. 21, 2023

(65) Prior Publication Data

US 2024/0304671 A1 Sep. 12, 2024

Related U.S. Application Data

(60) Provisional application No. 63/450,471, filed on Mar. 7, 2023.

(51) Int. Cl.
*H10D 30/69* (2025.01)
*H10D 30/01* (2025.01)
(Continued)

(52) U.S. Cl.
CPC ......... *H10D 30/751* (2025.01); *H10D 30/014* (2025.01); *H10D 30/43* (2025.01);
(Continued)

(58) Field of Classification Search
CPC ............. H10D 30/751; H10D 84/0128; H10D 84/0135; H10D 84/038; H10D 84/83; H01L 21/02532
See application file for complete search history.

(56) References Cited

U.S. PATENT DOCUMENTS 7,176,041 B2 2/2007 Lee et al.
7,402,483 B2 7/2008 Yun et al.
(Continued)

FOREIGN PATENT DOCUMENTS

FR 3143187 A1 * 6/2024 ........... H10D 62/314

OTHER PUBLICATIONS

Joung et al., Leakage Performance Improvement in Multi-Bridge-Channel Field Effect Transistor (MBCFET) by Adding Core Insulator Layer, College of Information Communication Engineering, Aug. 9, 2021, 4 pages, Sungkyunkwan University, Suwon, Gyeounggi-do, Republic of Korea.

*Primary Examiner* — Yara B Green
*Assistant Examiner* — Akhee Sarker-Nag
(74) *Attorney, Agent, or Firm* — Moser Taboada

(57) ABSTRACT

A method for forming a gate structure uses epitaxial growth to form the layers of the gate structure. The method includes epitaxially growing a first silicon germanium layer with a first germanium percentage on a silicon substrate, growing a first silicon layer on the first silicon germanium layer, growing a second silicon germanium layer with a second germanium percentage greater than the first germanium percentage, growing a second silicon layer on the second silicon germanium layer, selectively etching a portion of the first silicon germanium layer to form a recess; selectively depositing a low-k dielectric material to fill the recess, and selectively oxidizing the second silicon germanium layer throughout to form a silicon germanium oxide layer.

20 Claims, 5 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/83*** | (2025.01) |
| ***H10P 14/20*** | (2026.01) |

(52) U.S. Cl.
CPC ..... *H10D 30/6735* (2025.01); *H10D 30/6757* (2025.01); *H10D 62/121* (2025.01); *H10D 64/017* (2025.01); *H10D 84/0128* (2025.01); *H10D 84/0135* (2025.01); *H10D 84/038* (2025.01); *H10D 84/83* (2025.01); *H10P 14/3411* (2026.01)

(56) References Cited

U.S. PATENT DOCUMENTS

| | | | | |
|---|---|---|---|---|
| 10,340,358 | B2 | 7/2019 | Suh et al. | |
| 2016/0380078 | A1* | 12/2016 | Bu | H01L 21/0217<br>257/401 |
| 2022/0115498 | A1* | 4/2022 | Chu | H10D 30/6757 |
| 2022/0238707 | A1 | 7/2022 | Yang et al. | |
| 2024/0194485 | A1* | 6/2024 | Acosta Alba | H10D 30/027 |

* cited by examiner

METHODS FOR FORMING GATE STRUCTURES

CROSS-REFERENCE TO RELATED APPLICATIONS

This application claims the benefit of U.S. provisional patent application Ser. No. 63/450,471, filed Mar. 7, 2023, which is herein incorporated by reference in its entirety.

FIELD

Embodiments of the present principles generally relate to semiconductor processing of semiconductor substrates.

BACKGROUND

Gate-all-around field effect transistors (GAAFETs) have increased performance capabilities over planar transistors. Multi-bridge channel field effect transistors (MBCFETs) increase that performance by using multiple channels that bridge the source and drains. Despite the increased performances, demands for even better performing transistors are needed as technology moves forward. The inventors have observed that even though MBCFETs are higher performing, the MBCFETS have room for improvement with regard to leakage and gate controllability.

Accordingly, the inventors have provided methods for improving the electrostatic performance of MBCFETS, allowing for increased performance and reliability.

SUMMARY

Methods for forming a high-performance gate structure are provided herein.

In some embodiments, a method for forming a gate structure may comprise epitaxially growing a first silicon germanium layer with a first germanium percentage on a silicon substrate, epitaxially growing a first silicon layer on the first silicon germanium layer, epitaxially growing a second silicon germanium layer with a second germanium percentage greater than the first germanium percentage, epitaxially growing a second silicon layer on the second silicon germanium layer, selectively etching a portion of the first silicon germanium layer to form a recess, selectively depositing a low-k dielectric material to fill the recess, and selectively oxidizing the second silicon germanium layer throughout to form a silicon germanium oxide layer.

In some embodiments, the method may further include selectively oxidizing the second silicon germanium layer prior to selectively etching the portion of the first silicon germanium layer to form the recess, selectively etching the portion of the first silicon germanium layer to form the recess after oxidizing the second silicon germanium layer, and selectively depositing a low-k dielectric material to fill the recess after selectively etching the portion of the first silicon germanium layer, and/or selectively etching the portion of the first silicon germanium layer using a dielectric etch where the portion of the first silicon germanium layer is oxidized during oxidizing of the second silicon germanium layer.

In some embodiments, a method for forming a gate structure may comprise epitaxially growing a first silicon germanium layer with a first germanium percentage on a silicon substrate where the first germanium percentage is approximately 10% to approximately 40%, epitaxially growing a first silicon layer on the first silicon germanium layer, epitaxially growing a second silicon germanium layer with a second germanium percentage greater than the first germanium percentage where the second germanium percentage is approximately 40% to approximately 80%, epitaxially growing a second silicon layer on the second silicon germanium layer, selectively etching a portion of the first silicon germanium layer to form a recess, selectively depositing a low-k dielectric material to fill the recess, and selectively oxidizing the second silicon germanium layer throughout to form a silicon germanium oxide layer after selectively depositing the low-k dielectric material where the first silicon layer, the silicon germanium oxide layer, and the second silicon layer form a channel of the gate structure.

In some embodiments, a non-transitory, computer readable medium having instructions stored thereon that, when executed, cause a method for forming a gate structure to be performed, the method may comprise epitaxially growing a first silicon germanium layer with a first germanium percentage on a silicon substrate, epitaxially growing a first silicon layer on the first silicon germanium layer, epitaxially growing a second silicon germanium layer with a second germanium percentage greater than the first germanium percentage, epitaxially growing a second silicon layer on the second silicon germanium layer, selectively etching a portion of the first silicon germanium layer to form a recess, selectively depositing a low-k dielectric material to fill the recess, and selectively oxidizing the second silicon germanium layer throughout to form a silicon germanium oxide layer.

In some embodiments, the method of the non-transitory, computer readable medium may further include selectively oxidizing the second silicon germanium layer prior to selectively etching the portion of the first silicon germanium layer to form the recess, selectively etching the portion of the first silicon germanium layer to form the recess after oxidizing the second silicon germanium layer, and selectively depositing a low-k dielectric material to fill the recess after selectively etching the portion of the first silicon germanium layer.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
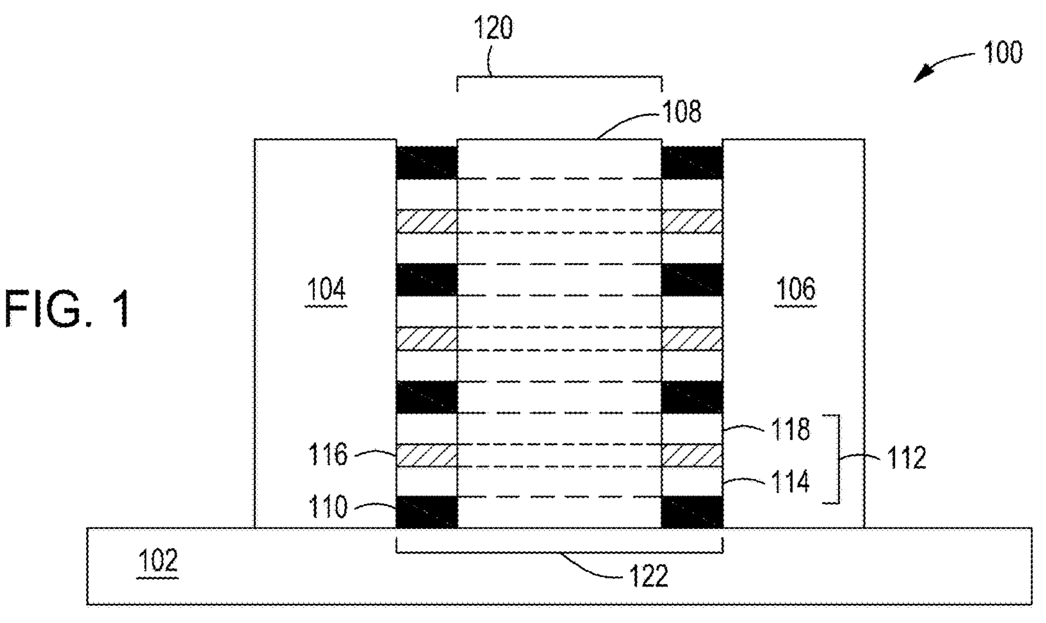
FIG. 1 depicts a side view of an MBCFET structure in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide a high-performance gate structure for a multi-bridge channel field effect transistor (MBCFET). The MBCFET has been proposed as a device that can improve the channel electrostatics of the gate-all-around (GAA) device by introducing an additional thin silicon dioxide ($SiO_2$) nanosheet (core insulator) to the existing silicon (Si) nanosheets of the gate channels. To accomplish such an architecture, the methods provided herein incorporate oxidation processes to provide manufacturable techniques for forming gate channels with a core insulator layer. A combination of oxidation and epitaxial growth processes allows the core insulator layer to be formed in a realistic and cost-effective manner to make fabrication in a manufacturing environment possible.

Based on the principles disclosed herein, a new gate structure is formed based on an epitaxial superlattice with different amounts (percentages) of germanium (Ge) in silicon germanium (SiGe) layers. In some embodiments, the superlattice is comprised of, for example, Si (nanosheet) layers (Ge0%), SiGe20% layers, and SiGe40% layers. The germanium percentages are examples and can be adjusted depending on process optimizations. The inventors have found that selective removal processes can be adjusted to be highly selective based on the percent germanium content. In some embodiments, selective etching is used to form a recess in the SiGe20% layers (selective over the SiGe40% layers and to the Si layers). The recess is then backfilled with a low-k inner spacer material. The SiGe40% can then be selectively oxidized using a low temperature radical oxidation and the like. Using the approach or like approaches, a thin silicon germanium oxide (SiGeO) layer (core insulator layer) can be introduced into the silicon nanosheets.

In FIG. 1, a side view of an MBCFET structure 100 is depicted in accordance with some embodiments. The MBCFET structure 100 includes a source 104, a drain 106, and a gate stack 120 that includes more than one gate channel 112. The gate channel 112 includes a first silicon layer 114, a second silicon layer 118, and a core insulator layer 116 therebetween. The gate channel 112 is separated from other gate channels by a high-k dielectric material 108 to increase capacitance between the gate channels. A low-k dielectric material 110 is used near the source 104 and drain 106 to reduce parasitic capacitance between the gate and drain/source. The dielectric constant, k, is a parameter used to indicate the ability of a material to store energy or charge. Silicon dioxide has a k-value of 3.9. Dielectric materials with a k-value less than 3.9 are considered to be low-k dielectric materials. Dielectric materials with a k-value of greater than 3.9 are considered to be high-k dielectric materials. In the example depicted, the MBCFET structure 100 is formed on a silicon substrate 102. GAA structures are typically constructed using a single concentration of silicon germanium. The methods described below are for forming the gate structure 122 of the MBCFET structure 100. A significant roadblock with the formation of such a gate structure 122 is that epitaxial growth on an oxide (core insulator layer) is not possible. Once the oxide layer is deposited, further formation of the stack would inhibit the use of epitaxial growth of subsequent layers. The inventors have discovered a solution that overcomes the manufacturing obstacles of forming such a gate structure.

Figure 2:
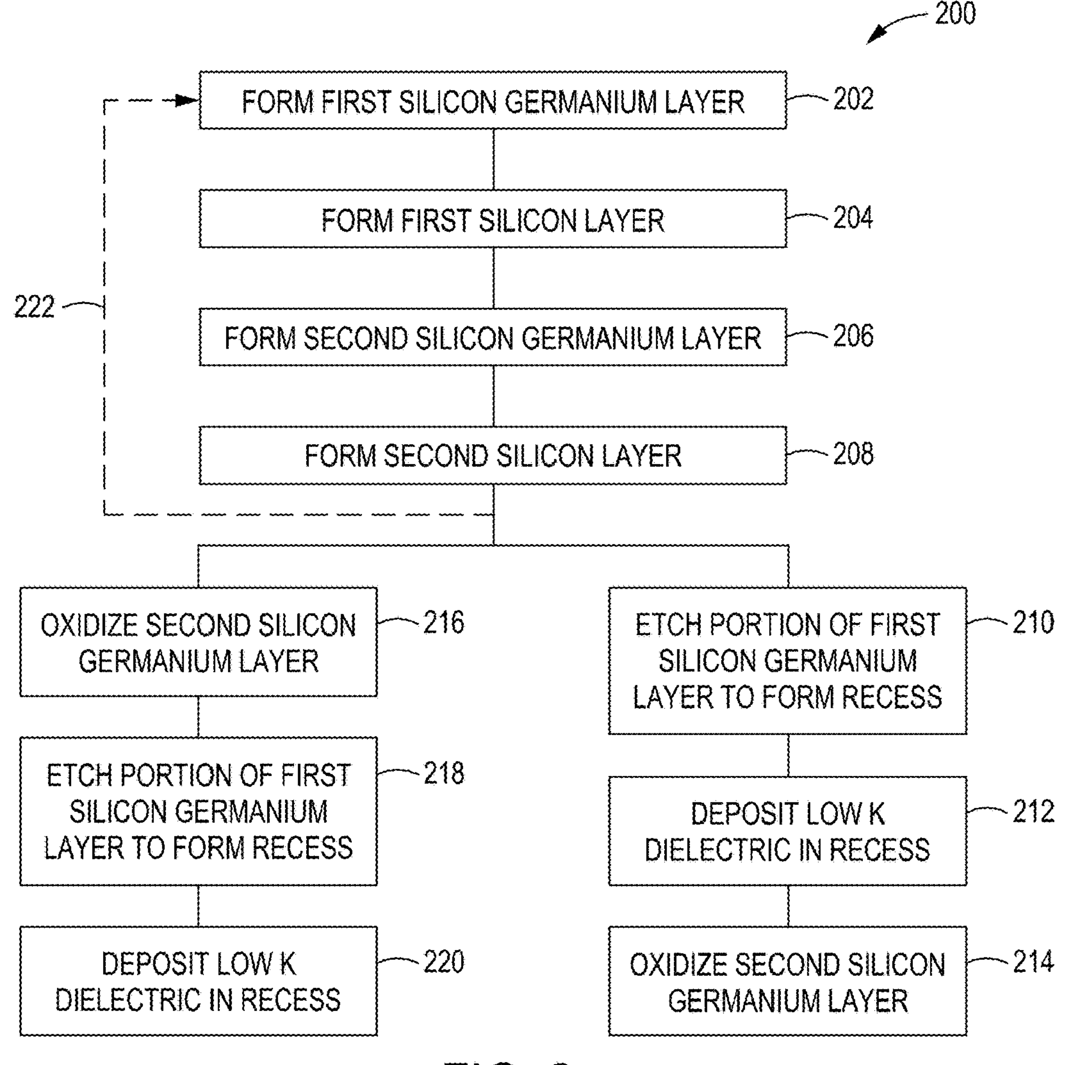
FIG. 2 depicts a method of forming a gate structure in accordance with some embodiments of the present principles.

FIG. 2 depicts a method 200 of forming a gate structure 122 in accordance with some embodiments. References will be made to FIGS. 3-5 in regard to the processes of the method 200. The method 200 leverages different percentages of germanium in silicon such as but not limited to, 0%, 20%, and 40% to allow selectivity of different processes for different layers of a gate during formation. The percentage of germanium in the silicon is a tradeoff—the goal is to have a reactivity difference with respect to the oxidation, the higher the germanium percent, the higher the reactivity, but too high of a germanium percent causes the quality of the layer to diminish, especially for the silicon. At some level of germanium percent, the epitaxial growth will have too much strain and will start to dislocate, introducing defects in the silicon layers. While the defects are significant to the quality of the silicon layers, the silicon germanium layers are sacrificial, as discussed below, and the impact of any defects is therefore of low concern for the silicon germanium layers.

Figure 3:
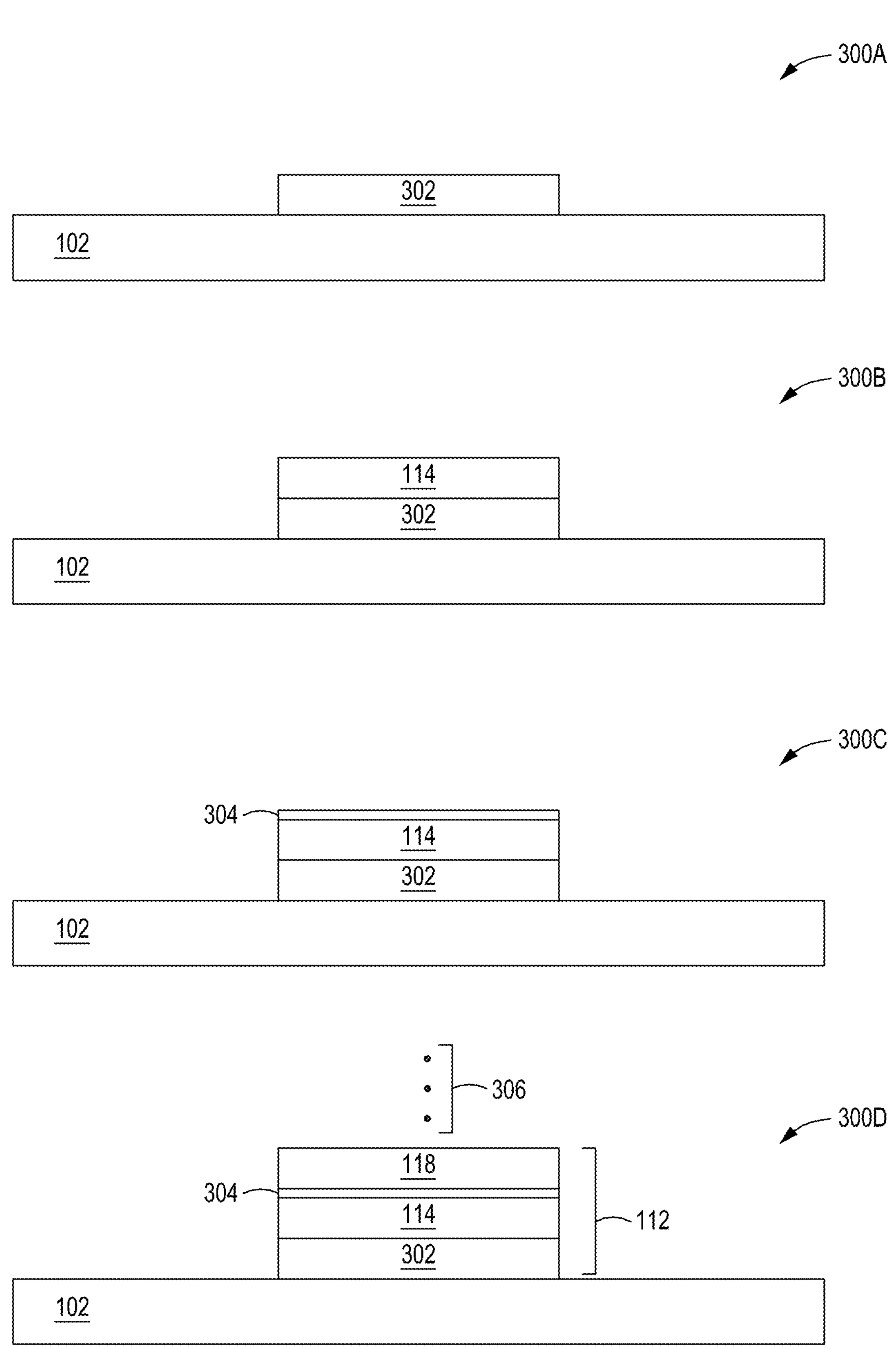
FIG. 3 depicts cross-sectional views of a process for forming a gate structure in accordance with some embodiments of the present principles.

In block 202, a first silicon germanium layer 302 is formed, for example, on a silicon substrate 102 as depicted in a view 300A of FIG. 3. The formation of the first silicon germanium layer 302 is accomplished via an epitaxial growth process on the silicon substrate 102. In some embodiments, the first silicon germanium layer 302 is grown to a thickness of approximately 5 nm to approximately 10 nm. The first silicon germanium layer 302 is a sacrificial layer that initially provides support for subsequent layers of the gate structure 122, but eventually different portions of the first silicon germanium layer 302 will be replaced by other materials used in the MBCFET structure 100. In some embodiments, the first silicon germanium layer 302 has a first germanium percentage of approximately 10% to approximately 40% germanium. In some embodiments, the first silicon germanium layer 302 has a first germanium percentage of approximately 20%. The percentage of germanium is used to allow for selective etching and oxidation of the gate structure layers.

In the case of the first silicon germanium layer 302, the first germanium percentage is selected to allow for selective etching of a portion of the first silicon germanium layer 302 and also to allow selective oxidation of a yet to be discussed second silicon germanium layer with a second germanium percentage different from the first silicon germanium percentage. The selection of the germanium percentage is not limited to only ranges that do not cause defects during the epitaxial growth process. Because the first silicon germanium layer 302 is sacrificial, the percentage of germanium is not limited by defects during the epitaxial growth. In other words, if the percentage of germanium causes dislocations during the growth, the defects will be removed when the first silicon germanium layer 302 is removed (sacrificial layer) or eliminated when the second silicon germanium layer is oxidized (amorphization of the layer).

In block 204, a first silicon layer 114 is formed on the first silicon germanium layer 302 using an epitaxial growth process as depicted in a view 300B of FIG. 3. In some embodiments, the first silicon layer 114 is grown to a thickness of approximately 5 nm to approximately 10 nm. In block 206, the second silicon germanium layer 304 is epitaxially grown on the first silicon layer 114 to a thickness of approximately 1 nm to approximately 5 nm. If the thickness is too thin, the formation of the second silicon germanium layer 304 may be too difficult to control and too difficult to maintain selectivity of subsequent oxidation with good penetration. If the thickness is too thick, the resulting core insulator layer 116 may be detrimental to the operation of the MBCFET structure 100. The second silicon germanium layer 304 will be subsequently oxidized in a process described below to form the core insulator layer 116 of the MBCFET structure 100. In the case of the second silicon germanium layer 304, the second germanium percentage is selected to allow for selective oxidation of the second silicon germanium layer 304 over the silicon layers and the first silicon germanium layer 302. In some embodiments, the second germanium percentage is approximately 40% to approximately 80%. In some embodiments, the second germanium percentage is approximately 40%. As the second silicon germanium layer 304 is thin (approx. 1 nm to approx. 5 nm), the layer's crystallinity may be maintained even with the germanium percent at approximately 80 percent. As discussed above, higher concentrations of germanium may lead to dislocations in the crystalline structure of the second silicon germanium layer 304, causing defects. However, as discussed below the second silicon germanium layer 304 is oxidized, eliminating the defects.

In block 208 of FIG. 2, a second silicon layer 118 is formed on the second silicon germanium layer 304 using an epitaxial growth process as depicted in a view 300D of FIG. 3. In some embodiments, the second silicon layer 118 is grown to a thickness of approximately 5 nm to approximately 10 nm. After oxidation of the second silicon germanium layer 304, the first silicon layer 114, the oxidized second silicon germanium layer, and the second silicon layer 118 form a gate channel 112. In some embodiments, the second germanium percent is at least approximately 20% greater than the first germanium percent to allow for selective etching of the first silicon germanium layer 302 over the first silicon layer 114, the second silicon germanium layer 304, and the second silicon layer 118 and to allow for selective oxidation of the second silicon germanium layer 304 over the first silicon layer 114, the first silicon germanium layer 302, and the second silicon layer 118. The formation of the gate channel 112 of method 200 can be repeated 222 (of FIG. 2) any number of times to form a stack of additional channels 306 prior to oxidizing (block 216) or etching (block 210). For example, the method 200 may be repeated to form the multiple gate channels of the MBCFET structure 100. After the formation of the second silicon layer 118, the etch processes and oxidation processes may be performed in varying order as indicated by blocks 210-214 and alternatively by blocks 216-220 of the method 200 of FIG. 2.

Figure 4:
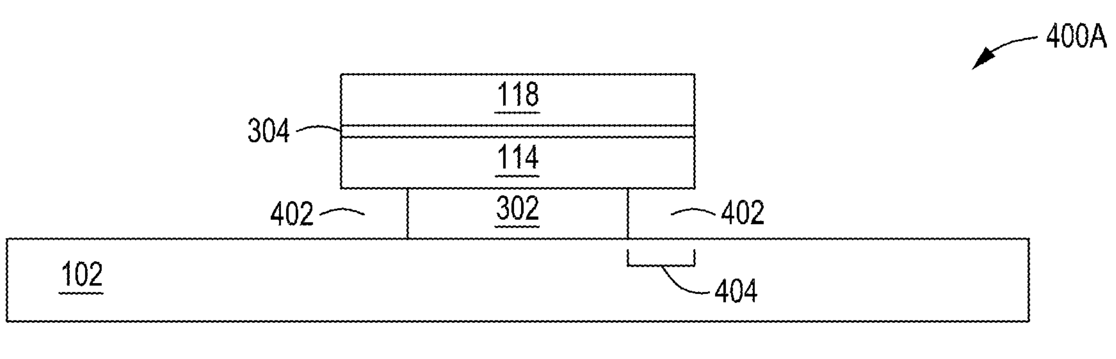
FIG. 4 depicts a cross-sectional view of recessing, backfilling, and oxidizing processes for a gate structure in accordance with some embodiments of the present principles.
Figure 4:
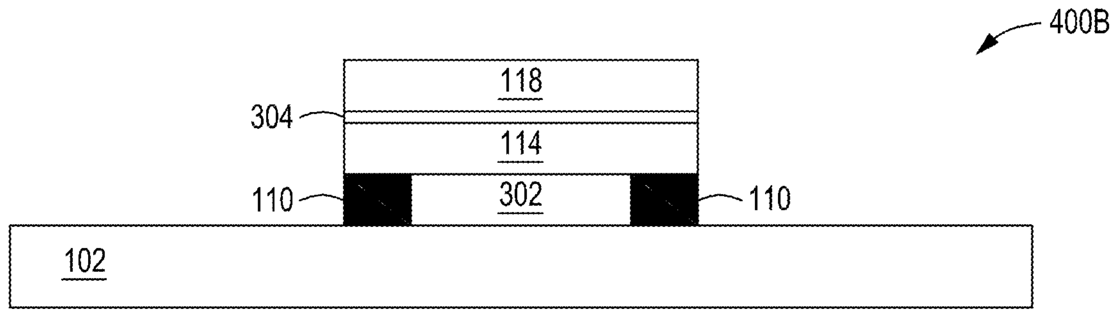
Figure 4:
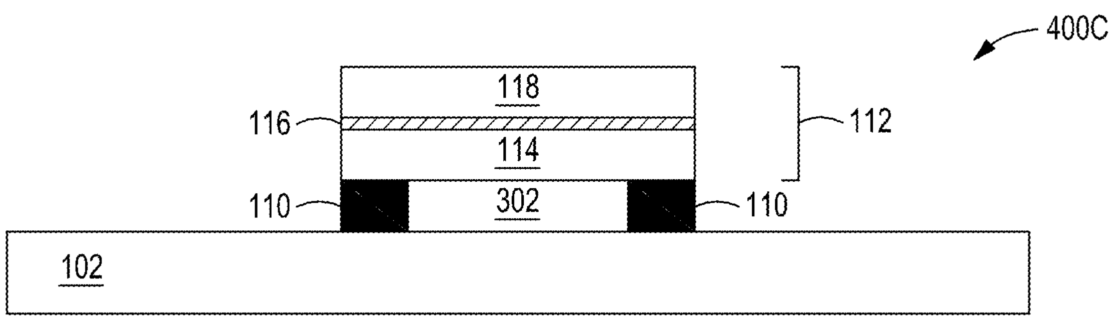

In block 210, a portion of the first silicon germanium layer 302 is selectively etched as depicted in a view 400A of FIG. 4 to form a recess 402 in the first silicon germanium layer 302. In some embodiments, the recess 402 will be etched to a depth 404 of approximately 3 nm or less. The selective etching produces a significantly higher etch rate on the first silicon germanium layer 302 over the second silicon germanium layer 304. The second silicon germanium layer 304 will undergo some very minor etching due to the much lower etch rate of the second silicon germanium layer 304. In block 212, a low-k dielectric material 110 is deposited in the recess 402 as depicted in a view 400B of FIG. 4. The low-k dielectric material 110 reduces parasitic capacitance between the gate and a source or a drain of the MBCFET structure 100. In block 214, the second silicon germanium layer 304 is oxidized throughout forming a silicon germanium oxide (core insulator layer 116) in the gate channel 112. In some embodiments, the selective oxidation may be accomplished using a low temperature radical oxidation process. The higher the concentration of germanium, the higher the oxidation rate. Thus, the second silicon germanium layer 304 is formed with a higher germanium percentage than the first silicon germanium layer 302 to increase selectivity of the second silicon germanium layer 304 during oxidation processes. The method 200 can be repeated to form multiple gate channels of the MBCFET structure 100. Further processing, not described herein, is required to complete the gate stack 120 of the MBCFET structure 100 depicted in FIG. 1 (such as replacement of the remaining portions of the first silicon germanium layer 302 depicted in view 400C of FIG. 4 with high-k dielectric material 108, etc.).

Figure 5:
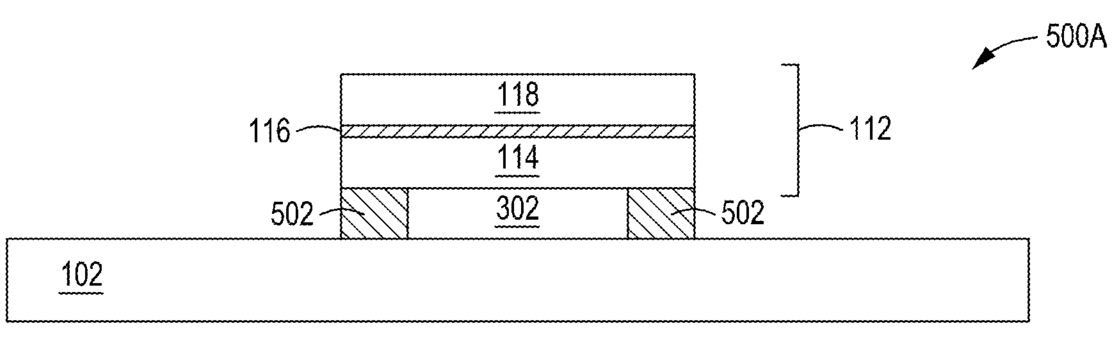
FIG. 5 depicts a cross-sectional view of oxidizing, recessing, and backfilling processes for a gate structure in accordance with some embodiments of the present principles.
Figure 5:
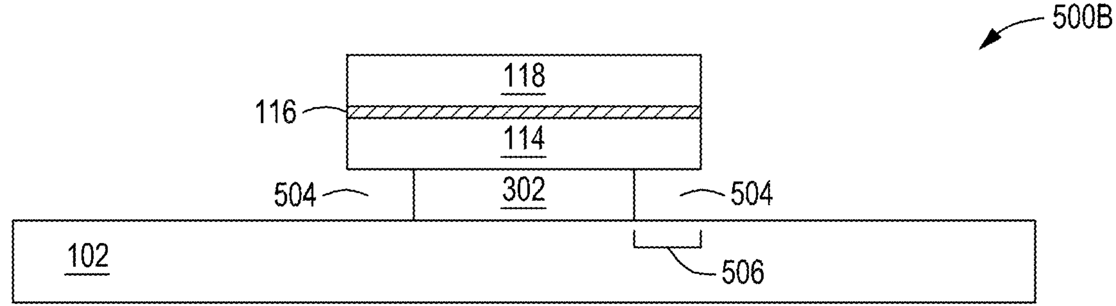
Figure 5:
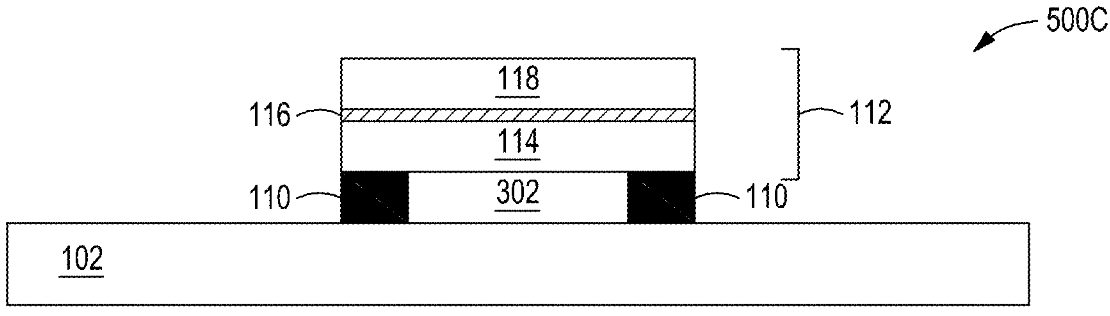

Alternatively, after formation of the second silicon layer (block 208) of the method 200, the second silicon germanium layer 304 may be selectively oxidized throughout forming a silicon germanium oxide (core insulator layer 116) in the gate channel 112 as depicted in a view 500A of FIG. 5. In some embodiments, the selective oxidation may be accomplished using a low temperature radical oxidation process. The higher the concentration of germanium, the higher the oxidation rate. Thus, the second silicon germanium layer 304 is formed with a higher germanium percentage than the first silicon germanium layer 302 to increase selectivity of the second silicon germanium layer 304 during oxidation processes. Although the oxidation is performed selectively over silicon and silicon germanium percentage, the first silicon germanium layer 302 will undergo some amount of oxidation in a portion 502 of the first silicon germanium layer 302 due to the germanium content but at a much slower oxidation rate. In the alternative process shown in blocks 210-214, the low-k dielectric material 110 deposited prior to the oxidation process kept the first silicon germanium layer 302 from being oxidized. However, by oxidizing prior to deposition of the low-k dielectric material 110, the first silicon germanium layer 302 will undergo some oxidation and the portion 502 will become silicon germanium oxide material with a lower germanium level than the core insulator layer 116.

In block 218, the portion 502 is selectively etched by leveraging the germanium content percentage to form recess 504 as depicted in a view 500B of FIG. 5. In some embodiments, the recess 504 will be etched to a depth 506 of approximately 3 nm or less. In block 220, the low-k dielectric material 110 is deposited in the recess 504 as depicted in a view 500C of FIG. 5. The low-k dielectric material 110 reduces parasitic capacitance between a gate and a source or a drain of the MBCFET structure 100. The method 200 can be repeated to form multiple gate channels of the MBCFET structure 100. The alternative path of blocks 216-220 are less controllable in the amount of oxidation of the first silicon germanium layer 302 as the oxidation is based on the oxidation of the second silicon germanium layer 304, as opposed to the path of blocks 210-214 which has better control of the etching depth of the first silicon germanium layer 302. Further processing, not described herein, is required to complete the gate stack 120 of the MBCFET structure 100 depicted in FIG. 1 (such as replacement of the remaining portions of the first silicon germanium layer 302 depicted in view 400C of FIG. 4 with high-k dielectric material 108, etc.).

Figure 6:
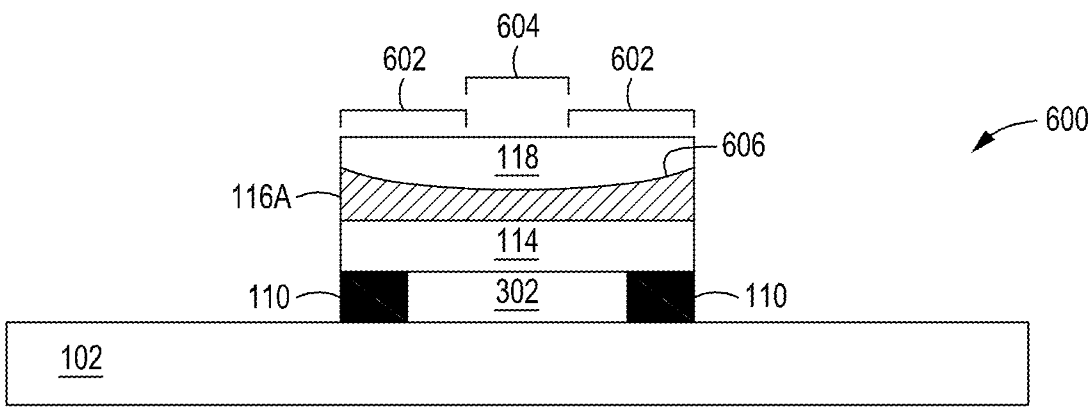
FIG. 6 depicts a cross-sectional view of a gate structure with a nonuniform core in a gate channel in accordance with some embodiments of the present principles.
Figure 7:
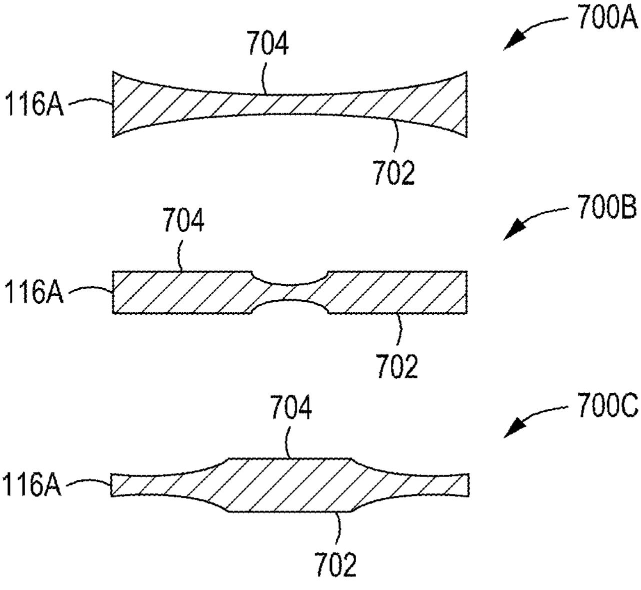
FIG. 7 depicts cross sectional views of nonuniform profiles of a core in a gate channel in accordance with some embodiments of the present principles.

For gate performance control, the core insulator layer 116A formed from the second silicon germanium layer 304 as described above may not be a uniform layer as depicted in an example in view 600 of FIG. 6. The core insulator layer 116A may have a nonuniform profile, such as but not limited to, thicker edge regions 602 than in a center region 604. In FIG. 6, the nonuniformity is found on an upper surface 606 of the core insulator layer 116A. In a view 700A, both an upper surface 704 and a lower surface 702 are nonuniform. In a view 700B, both the upper surface 704 and the lower surface 702 are nonuniform and have a center region with a much-reduced thickness compared to the edge regions. In a view 700C, the upper surface 704 and the lower surface 702 is nonuniform with a thicker center region compared to the edge regions. The nonuniform profile of the core insulator layer 116A can be adjusted to alter the electrostatic characteristics of the MBCFET structure 100.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming a gate channel structure, comprising:

epitaxially growing a first silicon germanium layer with a first germanium percentage on a silicon substrate;

epitaxially growing a first silicon layer on the first silicon germanium layer;

epitaxially growing a second silicon germanium layer with a second germanium percentage greater than the first germanium percentage;

epitaxially growing a second silicon layer on the second silicon germanium layer;

selectively etching a portion of the first silicon germanium layer to form a recess;

selectively depositing a low-k dielectric material to fill the recess; and selectively oxidizing the second silicon germanium layer throughout to form a silicon germanium oxide layer.

2. The method of claim 1, further comprising:

selectively oxidizing the second silicon germanium layer prior to selectively etching the portion of the first silicon germanium layer to form the recess;

selectively etching the portion of the first silicon germanium layer to form the recess after oxidizing the second silicon germanium layer; and selectively depositing a low-k dielectric material to fill the recess after selectively etching the portion of the first silicon germanium layer.

3. The method of claim 2, further comprising:

selectively etching the portion of the first silicon germanium layer using a dielectric etch, wherein the portion of the first silicon germanium layer is oxidized during oxidizing of the second silicon germanium layer.

4. The method of claim 1, wherein the first silicon layer, the silicon germanium oxide layer, and the second silicon layer form a channel of the gate channel structure.

5. The method of claim 1, wherein the first germanium percentage is approximately 10% to approximately 40% and the second germanium percentage is approximately 40% to approximately 80%.

6. The method of claim 1, wherein the second germanium percentage is at least approximately 20% greater than the first germanium percentage.

7. The method of claim 1, wherein the first silicon layer and the second silicon layer have a thickness of approximately 5 nm to approximately 10 nm.

8. The method of claim 1, wherein the first silicon germanium layer has a thickness of approximately 5 nm to approximately 10 nm.

9. The method of claim 1, wherein the second silicon germanium layer has a thickness of approximately 1 nm to approximately 5 nm.

10. The method of claim 1, wherein the silicon germanium oxide layer is nonuniform.

11. The method of claim 10, wherein the silicon germanium oxide layer has edge regions that are thicker than a center region.

12. A method for forming a gate channel structure, comprising:

epitaxially growing a first silicon germanium layer with a first germanium percentage on a silicon substrate, wherein the first germanium percentage is approximately 10% to approximately 40%;

epitaxially growing a first silicon layer on the first silicon germanium layer;

epitaxially growing a second silicon germanium layer with a second germanium percentage greater than the first germanium percentage, wherein the second germanium percentage is approximately 40% to approximately 80%;

epitaxially growing a second silicon layer on the second silicon germanium layer;

selectively etching a portion of the first silicon germanium layer to form a recess;

selectively depositing a low-k dielectric material to fill the recess; and selectively oxidizing the second silicon germanium layer throughout to form a silicon germanium oxide layer after selectively depositing the low-k dielectric material, wherein the first silicon layer, the silicon germanium oxide layer, and the second silicon layer form a channel of the gate channel structure.

13. The method of claim 12, wherein the second germanium percentage is at least approximately 20% greater than the first germanium percentage.

14. The method of claim 12, wherein the first silicon layer, the second silicon layer, and the first silicon germanium layer have a thickness of approximately 5 nm to approximately 10 nm.

15. The method of claim 12, wherein the second silicon germanium layer has a thickness of approximately 1 nm to approximately 5 nm.

16. The method of claim 12, wherein the silicon germanium oxide layer is nonuniform and has edge regions that are thicker than a center region.

17. A non-transitory, computer readable medium having instructions stored thereon that, when executed, cause a method for forming a gate channel structure to be performed, the method comprising:

epitaxially growing a first silicon germanium layer with a first germanium percentage on a silicon substrate;

epitaxially growing a first silicon layer on the first silicon germanium layer;

epitaxially growing a second silicon germanium layer with a second germanium percentage greater than the first germanium percentage;

epitaxially growing a second silicon layer on the second silicon germanium layer;

selectively etching a portion of the first silicon germanium layer to form a recess;

selectively depositing a low-k dielectric material to fill the recess; and selectively oxidizing the second silicon germanium layer throughout to form a silicon germanium oxide layer.

18. The non-transitory, computer readable medium of claim 17, further comprising:

selectively oxidizing the second silicon germanium layer prior to selectively etching the portion of the first silicon germanium layer to form the recess;

selectively etching the portion of the first silicon germanium layer to form the recess after oxidizing the second silicon germanium layer; and selectively depositing a low-k dielectric material to fill the recess after selectively etching the portion of the first silicon germanium layer.

19. The non-transitory, computer readable medium of claim 17, wherein the first silicon layer, the silicon germanium oxide layer, and the second silicon layer form a channel of the gate channel structure.

20. The non-transitory, computer readable medium of claim 17, further comprising at least one of (a), (b), (c), (d), or (e):

(a) wherein the first germanium percentage is approximately 10% to approximately 40% and the second germanium percentage is approximately 40% to approximately 80%;

(b) wherein the second germanium percentage is at least approximately 20% greater than the first germanium percentage;

(c) wherein the first silicon layer, the second silicon layer, or the first silicon germanium layer have a thickness of approximately 5 nm to approximately 10 nm;

(d) wherein the second silicon germanium layer has a thickness of approximately 1 nm to approximately 5 nm; or (e) wherein the silicon germanium oxide layer is nonuniform.

* * * * *